(12) United States Patent
Perez et al.

(10) Patent No.: US 7,350,160 B2
(45) Date of Patent: Mar. 25, 2008

(54) METHOD OF DISPLAYING A GUARD RING WITHIN AN INTEGRATED CIRCUIT

(75) Inventors: Charles N. Perez, Milton, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 10/604,059

(22) Filed: Jun. 24, 2003

(65) Prior Publication Data

US 2004/0268284 A1 Dec. 30, 2004

(51) Int. Cl.
*G06F 17/50* (2006.01)

(52) U.S. Cl. .................. 716/1; 716/9; 716/10
(58) Field of Classification Search .......... 716/1–18; 275/409, 483; 257/127

See application file for complete search history.

(56) References Cited

U.S. PATENT DOCUMENTS

| | | | | |
|---|---|---|---|---|
| 4,937,756 A | | 6/1990 | Hsu et al. | |
| 4,988,636 A | * | 1/1991 | Masleid et al. | 438/129 |
| 5,051,917 A | * | 9/1991 | Gould et al. | 716/17 |
| 5,369,595 A | * | 11/1994 | Gould et al. | 716/17 |
| 5,402,358 A | * | 3/1995 | Smith et al. | 716/9 |
| 6,073,343 A | * | 6/2000 | Petrick et al. | 29/825 |
| 6,078,085 A | * | 6/2000 | Suzuki | 257/369 |
| 6,086,627 A | * | 7/2000 | Bass et al. | 716/5 |
| 6,157,066 A | * | 12/2000 | Kobayashi | 257/363 |
| 6,321,367 B1 | * | 11/2001 | Chun et al. | 716/8 |
| 6,424,022 B1 | * | 7/2002 | Wu et al. | 257/665 |
| 6,446,250 B1 | | 9/2002 | Becker | |
| 6,449,748 B1 | * | 9/2002 | Jeng et al. | 716/4 |
| 6,480,995 B1 | | 11/2002 | Schmidt et al. | |
| 6,509,617 B2 | * | 1/2003 | Hiraga | 257/409 |
| 6,509,622 B1 | * | 1/2003 | Ma et al. | 257/483 |
| 6,550,047 B1 | * | 4/2003 | Becker | 716/8 |
| 6,734,567 B2 | * | 5/2004 | Chiu et al. | 257/778 |
| 6,900,969 B2 | * | 5/2005 | Salling et al. | 361/56 |
| 2001/0053948 A1 | * | 12/2001 | Kishida et al. | 700/121 |
| 2004/0114287 A1 | * | 6/2004 | Salling et al. | 361/56 |
| 2004/0164937 A1 | * | 8/2004 | Liedenbaum et al. | 345/76 |

OTHER PUBLICATIONS

Quincke J., Novel test structure for the investigation of the efficiency of guard ring used for I/O latch-up prevention, Mar. 1990, vol. 3, pp. 35-39.*

Ker et al., Automatic methodology for placing the guard ring into chip layout to prevent latch-up in CMOS IC's, Sep. 2001, vol. 1, pp. 113-116.*

* cited by examiner

*Primary Examiner*—Jack Chiang
*Assistant Examiner*—Nghia M. Doan
(74) *Attorney, Agent, or Firm*—Gibb & Rahman, LLC; Richard M. Kotulak, Esq.

(57) ABSTRACT

The invention displays a guard ring within an integrated circuit design by determining positions of the logic devices within the integrated circuit design, incorporating the guard ring into the integrated circuit design, and displaying the logic devices and the guard ring either graphically, semantically, or symbolically in a single display. The symbolic display comprises a parameterized symbol. The parameterized symbol displays parameters including the type of circuit, the type of guard ring and the efficiency of the guard ring. The invention displays the logic devices and the guard ring graphically by illustrating relative positions of the logic devices and the guard ring.

14 Claims, 9 Drawing Sheets

P-CELL/GUARD RING DESIGN P-CELL GRAPHIC UNIT INTERFACE

METHOD OF DISPLAYING A GUARD RING WITHIN AN INTEGRATED CIRCUIT

BACKGROUND OF INVENTION

1. Field of the Invention

The present invention generally relates to the integration of guard rings in a computer-aided design, verification, and checking system, and more particularly, for design integration of guard rings into computer chips.

2. Description of the Related Art

Guard rings are important in designs to isolate single components, circuits, sub-circuits, and functional design blocks. In single components, guard rings are used to prevent parasitic interaction between circuits, minimize carrier injection, latchup, and circuit coupling. Guard rings are used between NFETs, and PFETs to minimize CMOS latchup. Guard rings are used in ESD networks to isolate ESD networks from I/O circuits. Guard rings are used between I/O and core circuitry to isolate peripheral circuits from the core circuit.

As electronic components become smaller and smaller (along with the internal structures in integrated circuits) it is easier to either completely destroy or otherwise impair electronic components with latchup. Latchup occurs when a pnpn structure transitions from a low current high voltage state to a high current low voltage state through a negative resistance region (i.e. forming an S-Type I-V (current/voltage) characteristic).

Latchup is typically understood as occurring within a pnpn structure, or silicon controlled rectifier (SCR) structure. Interestingly enough, these pnpn structures can be intentionally designed, or even unintentionally formed between structures. Hence, latchup conditions can occur within peripheral circuits or internal circuits, within one circuit (intra-circuit) or between multiple circuits (inter-circuit).

Latchup is typically initiated by an equivalent circuit of a cross-coupled pnp and npn transistor. With the base and collector regions being cross-coupled, current flows from one device leading to the initiation of the second ("regenerative feedback"). These pnp and npn elements can be any diffusions or implanted regions of other circuit elements (e.g., P-channel MOSFETs, N-Channel MOSFETs, resistors, etc) or actual pnp and npn bipolar transistors. In CMOS, the pnpn structure can be formed with a p-diffusion in a n-well, and a n-diffusion in a p-substrate (parasitic pnpn). In this case, the well and substrate regions are inherently involved in the latchup current exchange between regions.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g. base width of the npn and base width of the pnp), current gain of the transistors, substrate resistance and spacings, the well resistance and spacings, and isolation regions.

Latchup can be initiated from internal or external stimulus. Latchup is known to occur from single event upsets (SEU). Single event upsets can include terrestrial emissions from nuclear processes, and cosmic ray events, as well as events in space environments. Cosmic ray particles can include proton, and neutron, gamma events, as well as a number of particles that enter the earth atmosphere. Terrestial emissions from radioactive events, such as alpha particles, and other radioactive decay emissions can also lead to latchup in semiconductors.

Latchup can occur from voltage or current pulses that occur on the power supply lines, such as VDD and VSS. Transient pulses on power rails (e.g. substrate or wells) can trigger latchup processes. Latchup can be initiated by negative transient on the VDD which can lead to a forward biasing of all the n-diffusions and n-well structures and electron injection through out the semiconductor chip substrate. This produces a "sea of electrons" injected in the chip substrate. Equivalently, a positive transient on the VSS can lead to hole injection, and forward biasing of the substrate-well junction providing a "sea of holes" event. Latchup can also occur from a stimulus to the well or substrate external to the region of the thyristor structure from minority carriers.

In internal circuits and peripheral circuitry, latchup is a concern can also occur as the result of interaction of the ESD device, the I/O chip driver, and adjacent circuitry initiated in the substrate from overshoot and undershoot phenomenon. These can be generated by CMOS off-chip driver circuitry, receiver networks, and ESD devices. In CMOS I/O circuitry, undershoot and overshoot can lead to injection in the substrate. Hence, both a p-channel MOSFET and n-channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, over-voltage dielectric limiting circuitry, bleed resistors, keeper networks, and other elements can be present leading to injection into the substrate. ESD elements connected to the input pad can also lead to latchup. ESD elements that can lead to noise injection, and latchup include MOSFETs, pnpn SCR ESD structures, p+/n-well diodes, n-well-to-substrate diodes, n+diffusion diodes, and other ESD circuits. ESD circuits can contribute to noise injection into the substrate and latchup.

In a semiconductor chip environment, there exists a plurality of different stimulus as well a plurality of circuit functions. Peripheral circuits include ESD networks, transmitter and receiver networks, system clocks, phase lock loops, capacitors, decoupling capacitors and fill shapes. Internal circuits can consist of DRAM memory, SRAM memory, gate arrays, and logic circuitry. Latchup can occur between interactions within a given circuit, or between circuits. In this complex environment, the latchup event can be an interaction of inter-circuit interaction or intra-circuit interactions.

Additionally, the interaction of the different circuits can lead to an initiation of a primary latchup event followed by a secondary latchup event. Since the circuits in a complex chip are coupled through the substrate, well, and power rails, circuit blocks and elements within a circuit block can be interactive.

By using guard ring structures, the likelihood of latchup in an integrated chip is decreased. The efficiency of the guard ring to prevent latchup is a function of the physical dimensions (height, width and depth), type, placement, and electrical connections. Verification and checking of guard rings has been difficult since guard rings do not have distinguishing features significantly different from standard shapes. As a result, in a GYM environment, and GL1, traditionally there was no means to verify the existence of guard rings as a design guideline or requirement in circuits and chips.

In an ESD design checking system, guard rings were "checked" by placement of the I/O dummy and ESD dummy virtual levels on the guard ring structure. This unfortunately caused two problems. One, the placement was not done systematically causing problems with fill shapes, fill excludes, and other spacing issues. Second, the placement was not identical in each design. Third, there was no means to verify the placement of the ESD and whether the I/O dummy was in fact on the guard ring structure. Hence, the placement and inclusion of the guard ring had no true verification and checking means.

Guard rings were never integrated in a fashion that addressed the true value of the design. Many designers did not place contacts, wiring, bussing, and physical dimensions leading to poor design practices and inadequate guard rings. The guard ring efficiency for all guard rings in designs were different and never consistent. Today, there is no means of evaluation of the guard ring efficiency from circuit design to model or means to determine latchup failure. In the design system, there was no symbology to verify the existence of guard rings in the schematics for visual verification. There was no means of checking, verification using LVS, DRC or other means.

In a Cadence based design systems (available from IBM Corporation, Armonk, N.Y., USA), there are presently no means of verification, checking and placement of guard ring structures. In a Cadence based system, a new design system was developed for ESD networks in mixed signal and RF applications. The ESD designs are hierarchical which are allowed to grow in physical dimension based on the user's choice of inherited parameters. In this system, these designs can be placed into existing space with existing guard rings from adjacent structures. Symbols exist for these designs but without a means to verify the existence or non-existence of guard rings.

It is the motivation of the inventors to provide checking and verification of a guard ring structure presence on a circuit where required. It is also the motivation of the inventors to integrate the guard ring efficiency into the design system and provide a design which has visual symbology which integrates with existing symbology of circuit elements, sub-circuit blocks, and circuit blocks. It is additionally the motivation of the inventors to allow for a grow-able guard ring which expands with a circuit, circuit block, and circuit function.

SUMMARY OF INVENTION

The present invention allows for designing of a guard ring structure, allows for choice of guard ring based on guard ring efficiency requirements whose shapes and rings are chosen accordingly, and allows for a growable guard ring which expands based on identification of the element type, the parameterized cell, circuit or function block design input parameters.

The present invention also allows for designing of a guard ring structure with generated virtual design levels (eg., guard ring virtual level, I/O virtual level, ESD virtual level), allows for a graphical and schematic representation view of a guard ring structure, allows for designing of a guard ring structure symbology and symbol, and allows for designing of a guard ring structure symbology and symbol hierarchy which integrates the existing circuit design symbol view with the guard ring symbol view. The present invention allows for checking of a guard ring structure, and allows for verification of a guard ring structure.

The invention displays a guard ring within an integrated circuit design by determining positions of the logic devices within the integrated circuit design, incorporating the guard ring into the integrated circuit design, and displaying the logic devices and the guard ring either graphically, semantically, or symbolically in a single display. The symbolic display comprises a parameterized symbol. The parameterized symbol displays parameters including the type of circuit, the type of guard ring and the efficiency of the guard ring. The invention displays the logic devices and the guard ring graphically by illustrating relative positions of the logic devices and the guard ring.

The invention also incorporates a guard ring into an integrated circuit design by identifying the type of circuit created by the logic devices, selecting the type of guard ring based on the type of circuit, incorporating the guard ring into the integrated circuit design, and verifying the operation of the guard ring within the integrated circuit design. The invention can add an electrostatic discharge (ESD) protection circuit to the integrated circuit design to protect the logic devices and identifies the type of ESD protection circuit added. The process of selecting the type of guarding is further based on the type of ESD protection circuit added. The type of circuit can be a radio frequency (RF) circuit, a digital circuit, or an analog circuit. The type of ESD protection circuit can be an input type, a power clamp type, or a type. The invention automatically adjusts the size and position of the guard ring as the size of the integrated circuit is changed and adjusts the guard ring based on guard ring efficiency requirements.

BRIEF DESCRIPTION OF DRAWINGS

The invention will be better understood from the following detailed description of preferred embodiments with reference to the drawings, in which.

DETAILED DESCRIPTION

Contrary to conventional systems that do not display or verify guard rings in semiconductor designs, the invention provides verification, checking, and circuit simulation to determine guard ring efficiency and latchup robustness. Thus, the invention provides intra- and inter-cell latchup parasitic information for latchup evaluation.

Circuits can change in circuit topology as well as physical space in the graphical representation. As a result, a guard ring needs to be able to expand with the growth of the hierarchical P-cell. The spacing of the design relative to the object or circuit is dependent on the circuit type and the elements contained in the system. The physical spacing of the guard ring relative to the circuit should prevent interaction between the circuit structures and the guard ring. Hence, in the invention, the spacing of the guard ring is based on the circuit type.

The invention provides representation for checking and verification of guard rings by having a graphical, schematic, and symbol representation. In this way, the system can visualize the presence of the guard ring, see the guard ring in the schematic representation and have the guard ring contained in the symbol function. Further, the invention allows for a hierarchical representation of the symbol function. The symbol function contains the information of the circuit, the inherited parameters, and graphical representation. By having a system which auto-generates a hierarchical symbol function and integrates the guard ring symbol and all of its spacings and inherited parameters (e.g. DT ring, nwell ring, n+ ring, p+ ring) a means of checking and verification of the guard ring is provided. Thus, the invention allows a guard ring symbol to be synthesized with a circuit symbol to form a hierarchical symbol.

The invention also integrates with an ESD and I/O checking design system. Since the hierarchical P-cells for ESD are identifiable by the design system, the ESD Dummy virtual level is auto-generated on the guard ring which contains the ESD hierarchical P-cell and is contained within the translation box containing all the design information. Thus, the invention places virtual levels on the guard ring structure.

Guard ring efficiency is an important design parameter. Each guard ring design can have a different guard ring efficiency. The invention allows a design to require a given guard ring efficiency. In the invention, the desired guard ring efficiency can be placed as a variable leading to auto-generation of the guard ring type, size, and spacing. Guard ring type will change the magnitude of the efficiency the guard ring will have on the circuit in question. Guard ring efficiency will increase linearly with the area or width of the design. Thus, the invention allows personalization and customization based on guard ring efficiency requirements.

Figure 1:
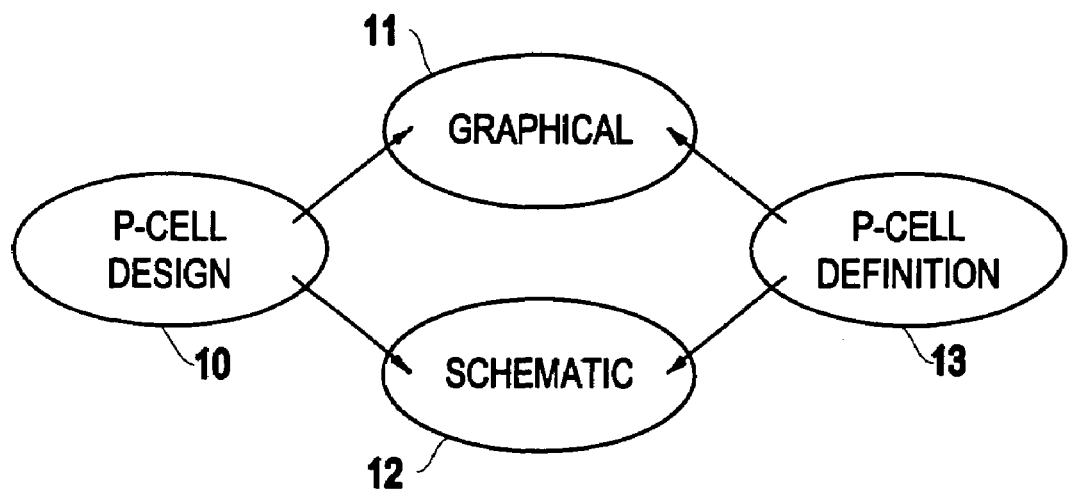
FIG. 1 is a schematic diagram showing a design system structure of the present invention for graphical and schematic representations.

FIG. 1 illustrates a design system structure of the present invention that integrates a parameterized cell (P-cell) design 10 and definition 13 using graphical 11 and schematic 12 representations. Thus, in the inventive design system, both graphical 11 and schematic 12 representations can be created from the design 10 and definition 13 of a parameterized cell. Graphical representations illustrate how the finished circuit will physically appear, while schematic representations illustrate functional devices and the interconnections between such devices. As discussed below, the invention can also provide symbol representations that are utilized in hierarchical circuit diagrams.

Figure 2:
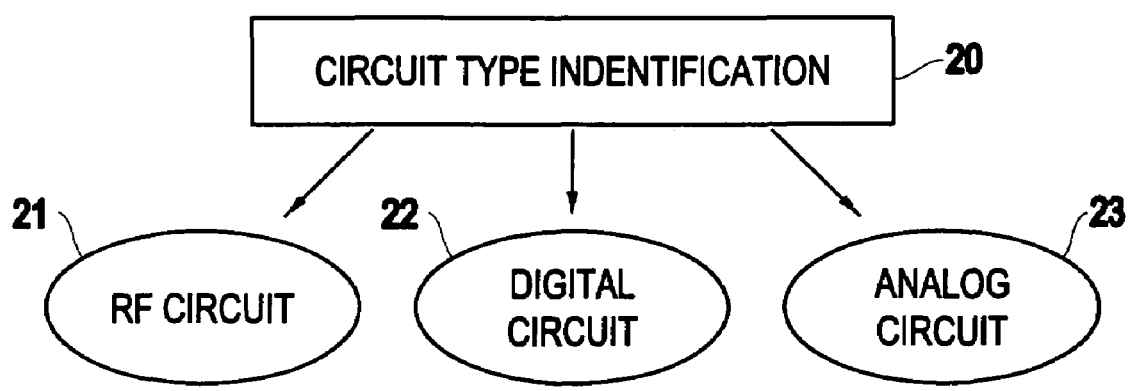
FIG. 2 is a schematic diagram illustrating a design system structure of the present invention for analog, RF, and digital circuits.

FIG. 2 illustrates that the invention provides a circuit-type identification unit 20 that identifies whether the circuit being evaluated is analog 23, RF 21, or digital 22. Circuit distinction can be determined by virtual design levels, the circuit symbol function, the "translation box," or the type of parameterized cell (P-Cell) utilized. For example, a first method of circuit-type identification creates dummy design levels to distinguish an RF circuit by placement of a virtual design level shape over the circuit. When the design level checking is initiated, the virtual level can be used for evaluation of the design rules within, on the perimeter, or outside of the virtual design level shape. A second method of circuit-type identification uses the higher order circuit symbol function. For example, a phase-lock loop (PLL) circuit is an analog circuit. A design symbol noted as PLL can be identified as analog by the name convention of the element. A third method of circuit-type identification uses the boundary box which stores all the identifiers of a P-Cell. The type of P-cell inside the circuit can also be an identifier. For example, the SiGe bipolar transistor may not be contained within a digital circuit; hence it is apparent that it can not be a digital circuit type. By evaluation of the circuit hierarchy, the circuit type and class can be identified. As mentioned above, latchup can occur in analog, RF, or digital circuits from the parasitic pnpn elements formed from the circuit. In CMOS, RF CMOS, and RF Silicon germanium (SiGe), latchup can occur as a result of low doped substrate concentrations. Evaluation and identification of the latchup sensitivity can be determined by evaluation of the parasitic elements from the parameterized cells.

The invention uses the circuit-type of indication unit 20 to classify the circuit to which the guard ring is being added. From the identification of the circuit type, the invention can automatically determine the types of guard rings which are appropriate for a given circuit which allows the guard ring to be auto-generated or manually created using graphical user interface (GUI). The parameter generation is chosen based on the design system requirements of the parameterized cells. The matching of the circuit type can be logically compared to the guard ring type to optimize the latchup robustness and prevent electrical injection to the substrate. From circuit simulation and knowledge of the parameters, latchup circuit simulation can be completed to evaluate the latchup robustness or sensitivity of the circuit. Since the parameterized cell translation box contains the parameterized input, all parameters are available to provide latchup simulation.

Figure 3:
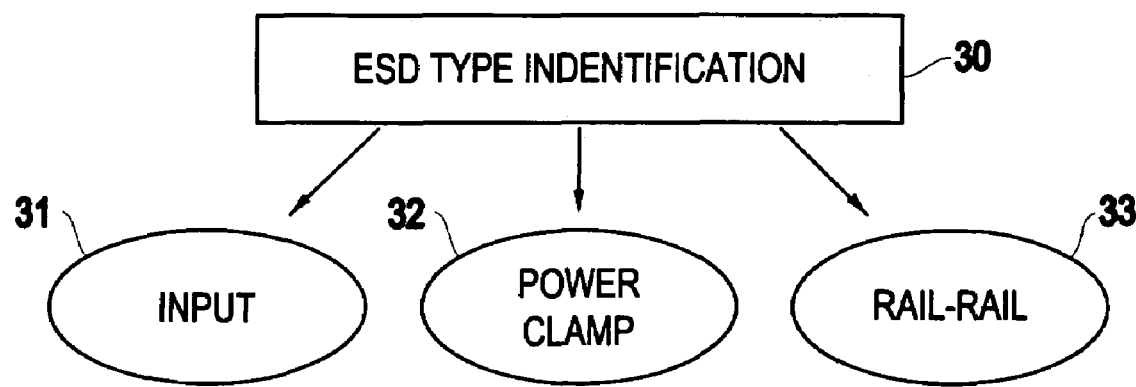
FIG. 3 is a schematic diagram illustrating a design system structure of the present invention for input, and power rail ESD elements.

Many circuits will include ESD (electrostatic discharge) protection circuitry. Therefore, FIG. 3 illustrates an ESD-type identification unit 30 that identifies whether the ESD protection circuit being utilized is an input ESD, power clamp ESD, or a rail-rail ESD. ESD circuit distinction can be determined by virtual design levels, the circuit symbol function, the "translation box" or the parameterized cell (P-Cell) utilized. For example, a first method of identification creates dummy design levels to distinguish an ESD circuit by placement of a virtual design level shape over the circuit which is integrated with the design and checking process. When the design level checking is initiated, the virtual level can be used for evaluation of the design rules within, on the perimeter, or outside of the virtual design level shape. First an ESD virtual design level can distinguish whether it is an ESD circuit or not an ESD circuit. If it is contained within the ESD shape, then it is an ESD circuit. An ESD level can be used to distinguish between an input device, a power rail, or a. In this identification, the input device is connected to an external power pad. Hence, an ESD shape which is connected to a wire and an input pad PAD label identifies it as a ESD input circuit. An ESD device can be identified as a circuit between two rails of a common label. Hence an ESD device will exist between a pin function label of VSS and AVSS. Hence any designator of "VSS" in the first and second "pin" connection indicates this element is between two grounds and must be a ESD element. The intersection of the power rails with the ESD virtual shape will allow the distinction. A second method is by the higher order circuit symbol function. For example, an ESD power clamp circuit is an ESD circuit. A design symbol noted as ESD Power Clamp can be identified as ESD circuit by the name convention of the element. A third method looks to the boundary box which stores all the identifiers of a P-Cell. For example, a ESD power clamp may contain a SiGe bipolar transistor whereas it may not be present in the other types. The type of P-cell inside the circuit can also be an identifier. For example, the SiGe bipolar transistor may not be contained within a ESD input circuit; hence, it is apparent, that it can not be a ESD input type. By evaluation of the circuit hierarchy, the circuit type and class can be identified. The invention bases the decision on which types of guard rings are appropriate partially upon the type of ESD circuit that is included within the circuit is a question. For example, for input node ESD devices, n–well guard rings may be required; whereas for ESD power clamps, a different type of physical parameters may be defined based on the power supply voltage conditions (VCC, VDD, VEE, or high voltage conditions).

Figure 4:
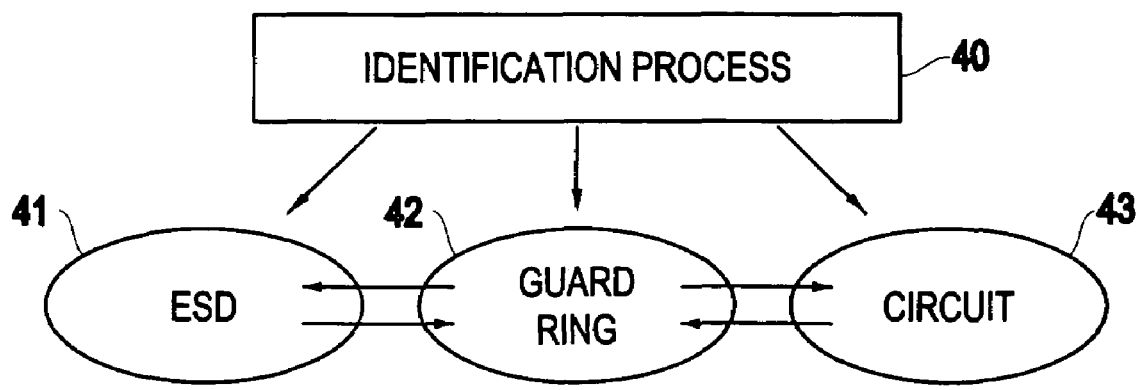
FIG. 4 is a schematic diagram illustrating a design system structure of the present invention for ESD.

FIG. 4 illustrates the overall identification processor 40 (which conceptually is the ESD-type identification unit 30 combined with the circuit-type of verification unit 20) that selects the appropriate type of guard ring 42 based upon the type of ESD protection circuit 41 and the type of circuit in question 43. Identification of the circuit type, the ESD type, and the guard ring P-cell allows for verification and checking to minimize the risk of latchup. Thus, after the invention adds the guard ring, a checking and verification process is performed based on the circuit type, the guard ring efficiency requirements, and physical dimensions of the guard ring and devices within the circuit to determine the latchup sensitivity of the circuits after the guard ring has been added. More specifically, from the physical dimensions of the higher P-cell, the parasitics are evaluated to determine guard ring efficiency, parasitic transistor current gains, and lateral device effects. By checking the guard ring parameterized cell, the verification and checking process confirms that the correct guard ring and its variables are suitable to minimize latchup in the parameterized cell. In the verification process, it may be a requirement that a I/O circuit containing an NFET must have a p+ and n-well guard ring. In this case, the P-cell of the NFET is verified, and that there exists a guard ring P-Cell that has the p+ and n-well ring verified "yes" in the P-Cell parameter listing. From the graphical unit interface (GUI), the parameters are contained. The "translation box" information of the guard ring P-cell contains the input designator of the guard ring and the correspondence between the guard ring and the NFET is verified as valid. In the design system, logical rules must be defined to state what type of circuits and elements are associated with what type of guard ring variables.

Figure 5:
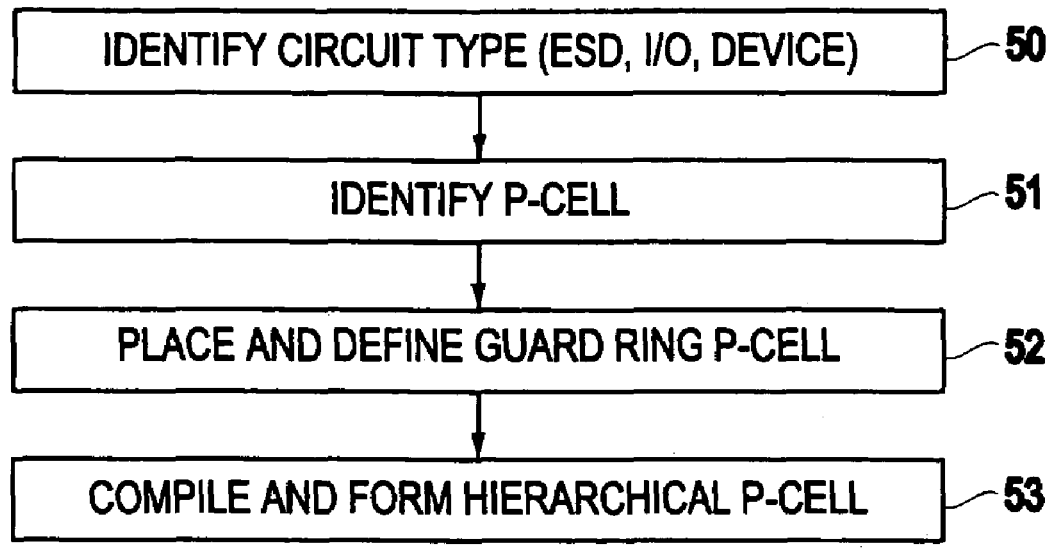
FIG. 5 is a schematic diagram illustrating a methodology of the present invention of the guard ring structure for ESD.

FIG. 5 is a flowchart that illustrates that the invention first identifies the type of circuit (and the type of ESD protection) 50. This allows the invention to create a parameterized cell (P-cell) 51. The invention then selects the appropriate type of guard ring and places the guard ring within the P-cell 52. The combined guard ring and P-cell are produced and can be used in a hierarchical circuit design 53. The parameterized cell in item 53 contains all the key circuit and parasitic information (e.g., in a technology data file).

Figure 6:
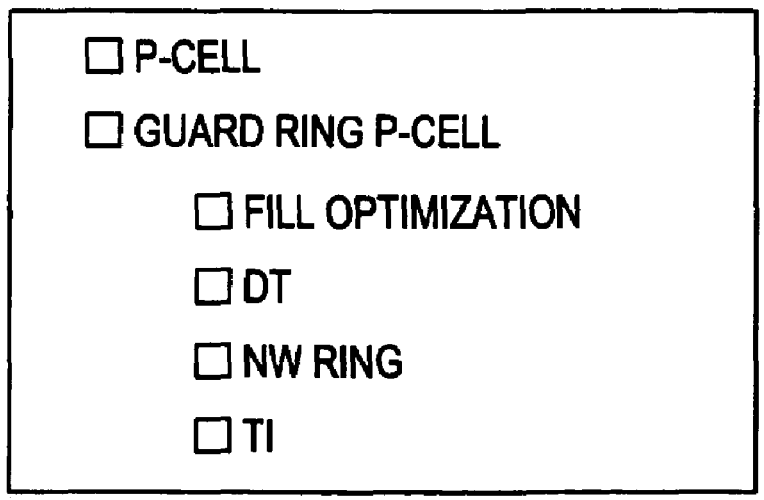
FIG. 6 is a schematic diagram illustrating a methodology of the present invention for a graphical user interface (GUI) for guard ring generation, definition, and design using a guard ring parameterized cell.

FIG. 6 shows an exemplary graphic user interface that can be utilized with the invention. As mentioned above, the invention can automatically select the appropriate guard ring or the user can select a guard ring using the graphic user interface shown in FIG. 6. A guard ring P-cell can include a number of different guard ring structures, as well as a plurality of consecutive regions. Guard rings can be a p+ diffusion ring, a n-diffusion ring, an n-well diffusion, a trench isolation (TI), a moat region, a triple well N-band region, an isolating region (forming an isolated device within the region), a deep trench (DT), a buried layer film, or an insulating film (e.g., silicon-on-insulator buried oxide region). Each type of guard ring structure is a function of the technology file and the type of structures allowed. In the technology data file, the types of possible guard rings are defined. FIG. 6 illustrates possible types of guard rings available in a specific situation. Hence, the GUI interface accesses the technology data file to define the type of guard rings available and different technologies that will require different GUI inputs.

Additionally, the guard ring dimensions are a function of the technology generation and ground rules. As a result, the guard ring P-cell must access technology information to define the maximum and minimum spatial dimensions. Also, each type of guard ring will have a different guard ring efficiency number. Guard ring efficiency can be evaluated in advance and stored in the translation box for the guard ring P-cell. A data lookup table can exist based on the type of guard ring, the order of the rings, the configuration, physical dimensions and spaces, and the power supply connections. Analytical equations can also be used to define the guard ring efficiency. The efficiency number variables used to perform the calculation include the physical dimensions, the depth, the type of guard ring, the electrical connections, and the physical spacing. The guard ring efficiency will determine how many carriers are absorbed or transmitted past the guard ring structure. After the guard ring is defined by the GUI input contents (FIG. 6), the electrical model, parasitics and the guard ring efficiency can be calculated and stored for electrical evaluation of latchup robustness.

Figure 7:
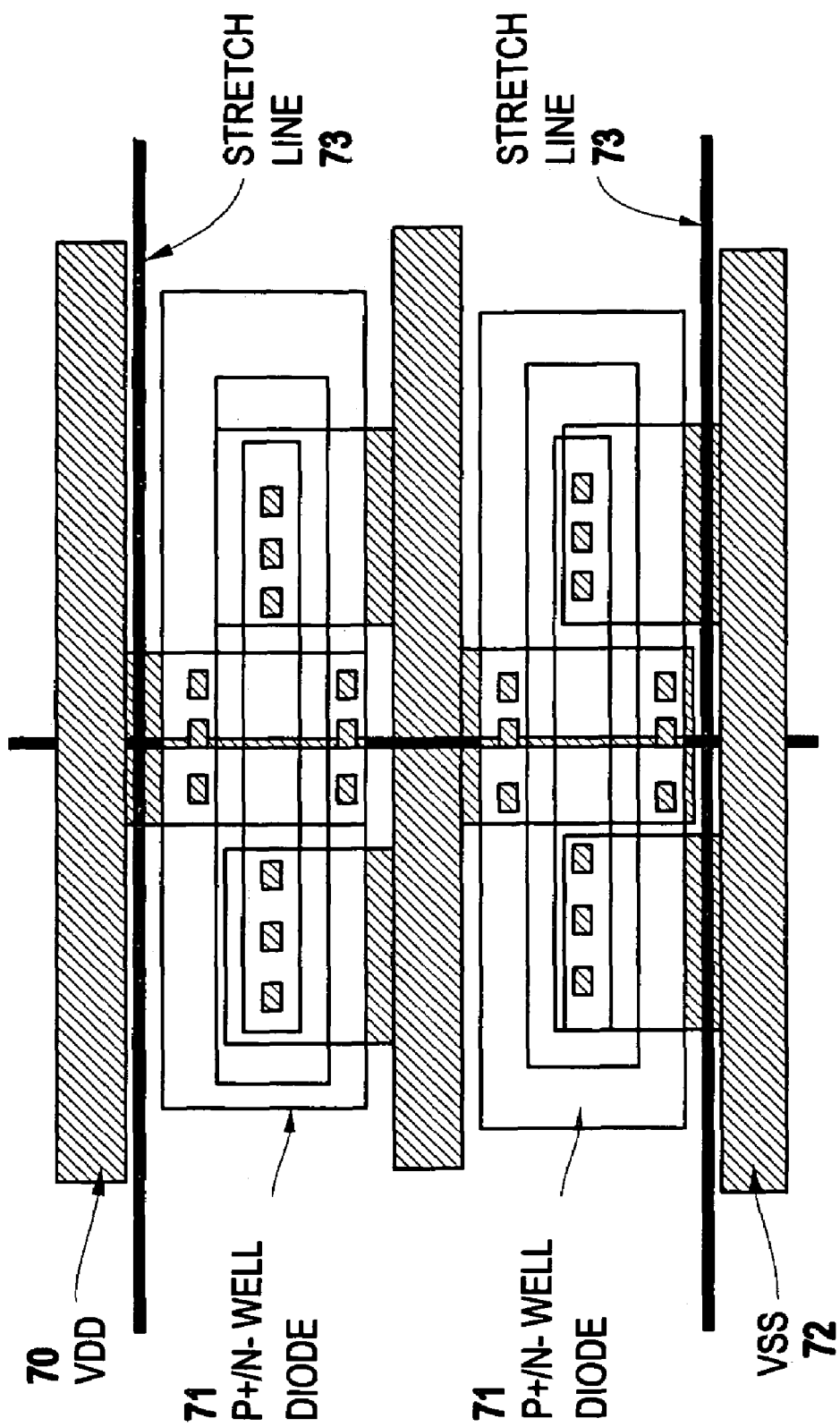
FIG. 7 is a schematic diagram illustrating a methodology of the present invention of an input node ESD P-cell graphical method using a hierarchical ESD parameterized cell.
Figure 8:
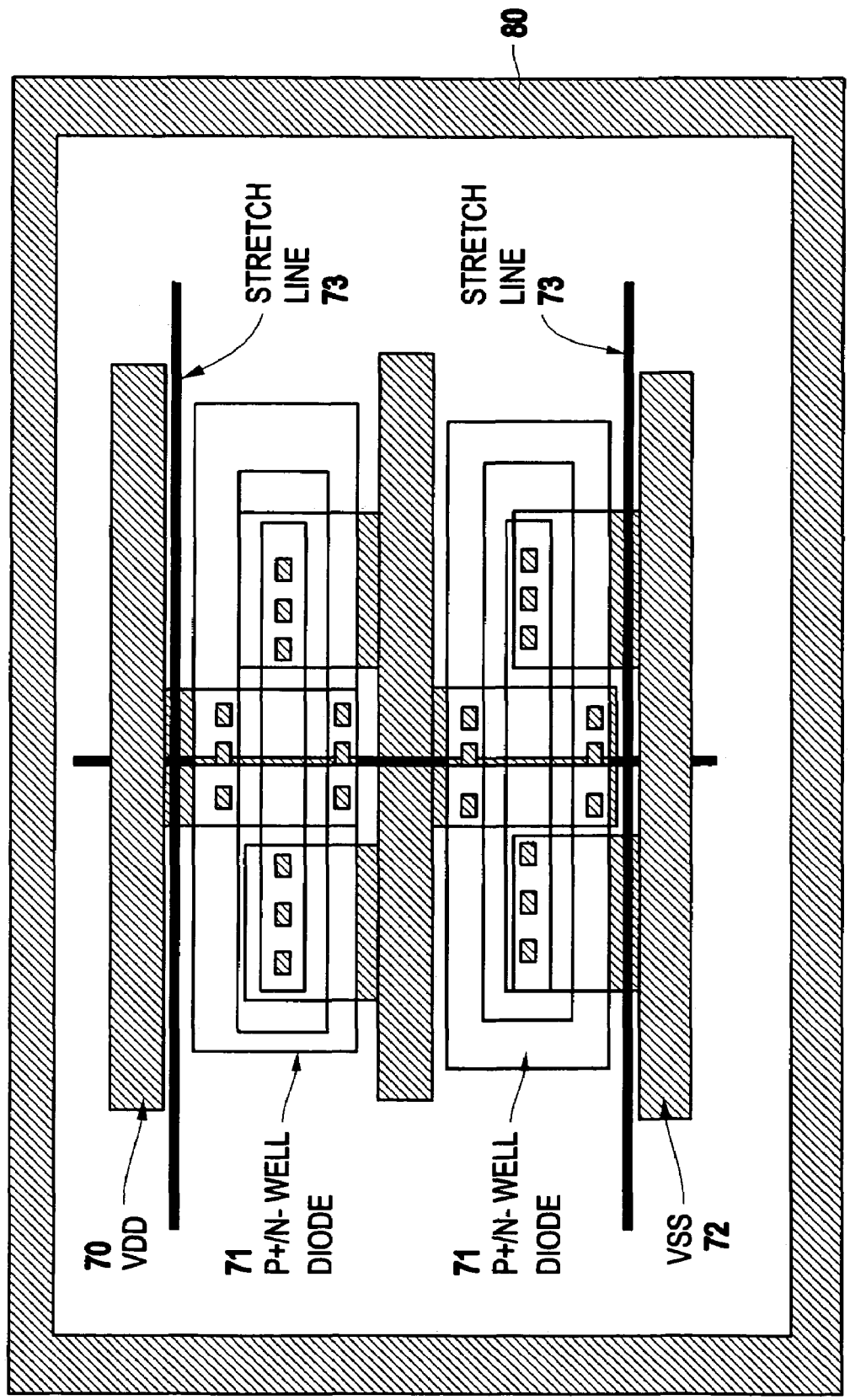
FIG. 8 is a schematic diagram illustrating a methodology of the present invention of integration of a guard ring parameterized cell with an input node ESD P-cell graphical method using a hierarchical ESD parameterized cell.

FIG. 7 is a graphical illustration of an input node ESD P-cell that can be used in a hierarchical design. This P-cell includes voltage lines VDD 70 and VSS 72 P+/N− well diodes 71 that are positioned between the stretch lines 73. This P-cell can be auto-generated and actually contains two primitive parameterized (twin diodes). FIG. 8 illustrates the same structure as that shown in FIG. 7 and includes the guard ring 80. In this implementation, the new P-cell is modified in that it is now contain all the data information of the parameterized cell guard as well as the ESD P-cell.

Additionally, the relative placement (spacing) of the two P-cells (the input node ESD P-cell and the guard ring P-cell) will allow evaluation of the parasitic elements formed between the first and second P-cells. For example, a lateral npn can be formed between the ESD P-cell well, and the guard ring (if of n-type dopant). This parasitic npn can be represented as an additional circuit element within the hierarchical P-cell and can be used to evaluate the injection to the guard ring P-cell and its effectiveness in absorbing electrical current. In this fashion, the guard ring efficiency can be evaluated based on its effectiveness in collecting and absorbing electrical transient currents, noise injection, and other latchup inducing sources of current. This information can be stored in the higher hierarchical P-cell information for evaluation of latchup sensitivity from internal or external sources. Hence, the integration of the first and second parameterized cells (the input node ESD P-cell and the guard ring P-cell) leads to the ability to evaluate latchup, guard ring efficiency, and the interaction between the first ESD P-cell and its adjacent guard ring. In this fashion, circuit simulation can be performed and latchup sensitivity can be evaluated as a result of the P-cell circuit schematic cell view that contains the parasitic information.

Figure 9:
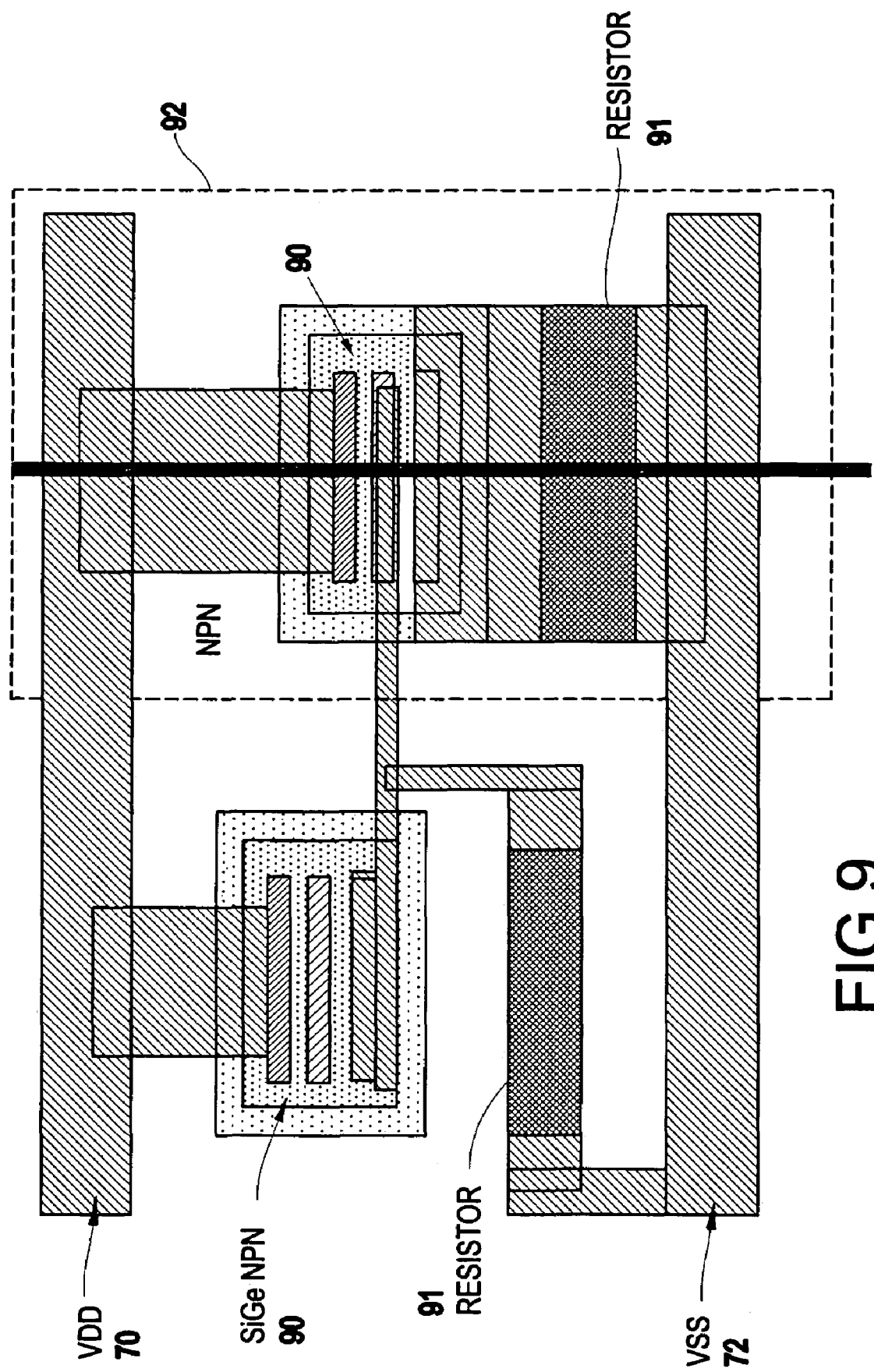
FIG. 9 is a schematic diagram illustrating a methodology of the present invention of a power rail ESD P-cell graphical method using a hierarchical ESD parameterized cell.
Figure 10:
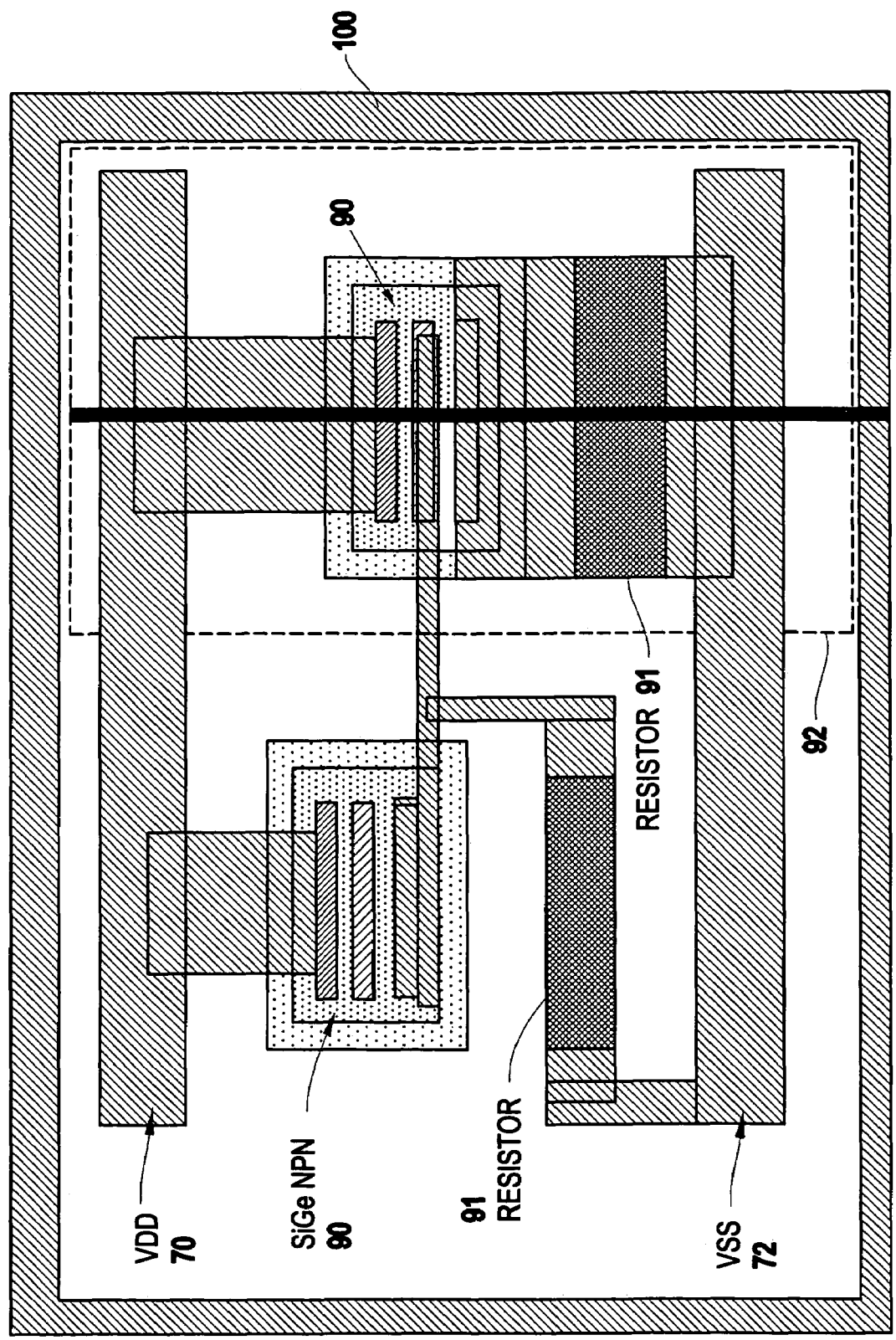
FIG. 10 is a schematic diagram illustrating a methodology of the present invention of integration of a guard ring parameterized cell with power rail ESD P-cell graphical method using a hierarchical ESD parameterized cell.

FIG. 9 is a graphical illustration of a power rail ESD P-cell. In this case, the P-cell has npn transistors 90 between first and second power supplies 70, 72 through resisters 91. This parameterized cell contains both graphical and circuit representation, as well as a symbol function. The symbol function is represented by box 92. FIG. 10 illustrates the same structure after the guard ring 100 is added. By integrating a guard ring P-cell 100 with the ESD P-cell, parasitic devices, the guard ring efficiency, and latchup robustness can be evaluated. From the graphical representation, the spacing between the elements can be evaluated to determine the parasitic strengths of the elements and electrical properties. The technology data file also is utilized for doping information, and recombination physics. The latchup robustness and parasitic sensitivities can be utilized for electrical evaluation and latchup robustness of the elements. Checking and verification as well as algorithms to determine the latchup robustness are utilized to provide latchup robustness. The invention requires evaluation of intra-P-cell elements as well as inter-P-cell parasitics between the guard ring P-cell and enclosed circuit. The algorithms used would contain the parasitic bipolar transistors and diodes. The variables would contain the physical dimensions, spaces, and doping concentrations. For example, to evaluate the parasitic bipolar transistor formed between an n-well element and an n-well guard ring structure, the invention evaluates the n-well to n-well space. The n-well to n-well space is the base width of the lateral npn transistor. Additionally, the invention evaluates the emitter and collector depths. The invention also determines the substrate doping concentration, which is in the technology data file information, which forms the base doping concentration. From these terms, the lateral bipolar gain can be calculated.

Figure 11:
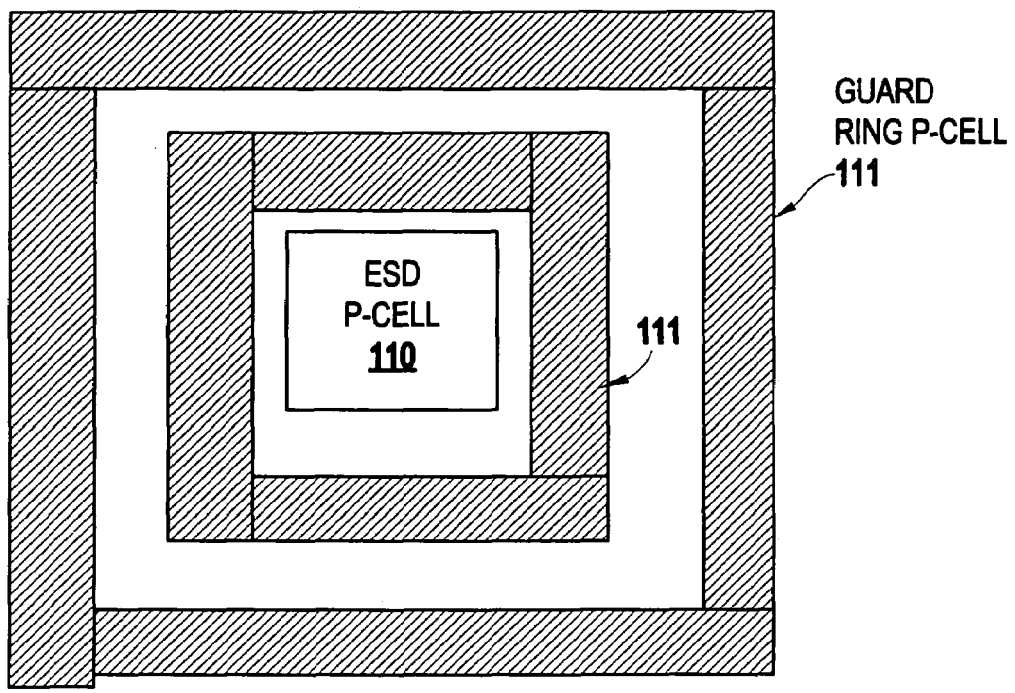
FIG. 11 is a schematic diagram illustrating methodology of the present invention of integration of a guard ring parameterized cell with an ESD P-cell placement and generation graphical method using a hierarchical ESD parameterized cell.

FIG. 11 is a graphical representation of a guard ring parameterized cell integrated with an ESD P-cell 110. In the guard ring P-cell a plurality of rings 111 are shown. The guard rings can be a p+ diffusion ring, a n+ diffusion ring, an n-well diffusion, a trench isolation (TI), a moat region, a triple well N-band region, an isolating region (forming an isolated device within the region), a deep trench (DT), a buried layer film, an insulating film (e.g., silicon on insulator buried oxide region) or other similar structure. Each type of guard ring structures are a function of the technology file and the type of structures allowed. In the technology data file, the types of possible guard rings are defined. Electrical interconnects to these can be used in the GUI interface to connect to power supplies, grounds, reference circuits, or any desired electrical connections.

Figure 12:
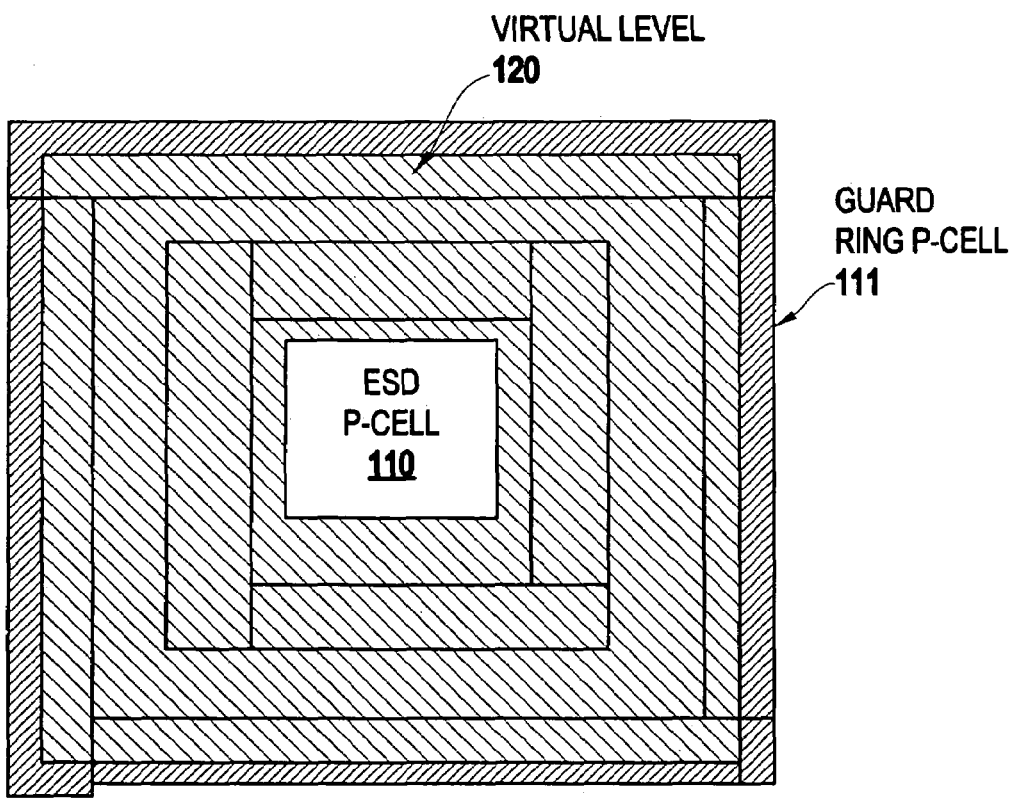
FIG. 12 is a schematic diagram illustrating a methodology of the present invention of integration of a virtual design level with a guard ring parameterized cell with an ESD P-cell placement and generation graphical method using a hierarchical ESD parameterized cell.

FIG. 12 is a virtual design level illustration of the structure shown in FIG. 11. FIG. 12 shows that virtual levels 120 can be integrated into the design as well as actual design levels. Therefore, while the location of the ESD p-cell 110 is the same in FIGS. 11 and 12, the guard ring p-cell 111 is shown differently because of the presence of the virtual levels 120. Virtual levels may be used for design verification and checking to determine the adequacy of the guard rings, placement, ground rule definition and compliance, as well as a means to visualize the guard ring hierarchy. Virtual levels may contain the parasitic information, latchup robustness variables, guard ring efficiency, or other latchup or ESD metrics which may be used for ESD and latchup verification. In FIG. 12, the virtual level is placed over the guard ring and ESD P-cell. In this fashion, the invention can evaluate whether there exists an ESD P-Cell element; whether there exists a guard ring P-cell; and whether the guard ring p-cell encloses the ESD P-Cell. The invention also evaluates the identification of the ESD type under the virtual level, and the identification of the guard ring type under the virtual level. The invention evaluates the stored information of the ESD type and the stored information of the guard ring P-Cell type (this can identify the dimensions, the spacings, the type of element, and the physical model associated with those elements). Further, the invention evaluates the physical spacing between the two P-Cells, the latchup robustness sensitivity of the type of P-cell, and the nature of the P-Cell as "injecting type" or "collecting type", etc. In this fashion, the physical information can be established, and the proper input variables can be established. The algorithms used would contain the parasitic bipolar transistors and diodes. The variables would contain the physical dimensions, spaces and doping concentrations.

Figure 13:
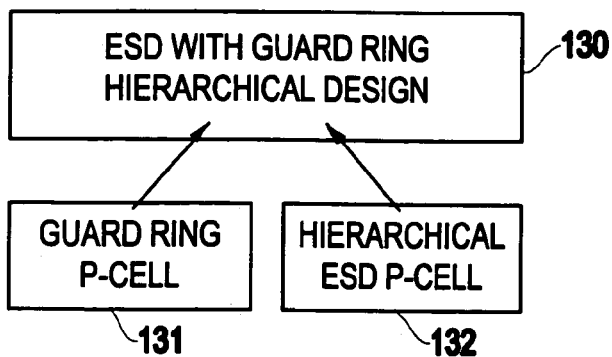
FIG. 13 is a schematic diagram illustrating a methodology of the present invention of a guard ring parameterized cell with an ESD P-cell placement and generation of a hierarchical ESD parameterized cell.
Figure 14:
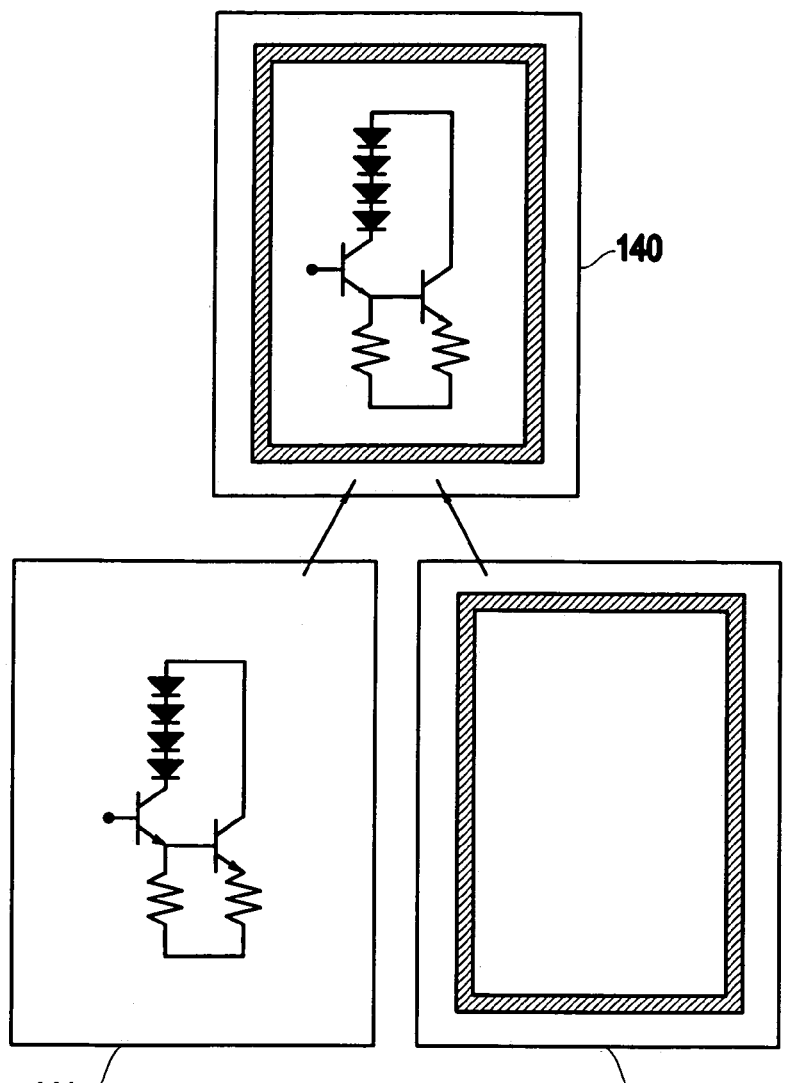
FIG. 14 is a schematic diagram illustrating a methodology of the present invention of a hierarchical guard ring/circuit symbol function for generation of a symbol cellview.

FIG. 13 illustrates a hierarchical structure used for the graphical, circuit schematic, or symbol hierarchy. In FIG. 13, the guard ring P-cell 131 and hierarchical ESD P-cell 132 are combined to form the ESD guard ring hierarchical design 130. FIG. 14 illustrates the same hierarchy in a symbol cell view where the guard ring P-cell 142 in FIG. 14 corresponds to item 131 in FIG. 13, the hierarchical ESD P-cell 141 in FIG. 14 corresponds to item 132 in FIG. 13, and the ESD with the guard ring hierarchical design 140 in FIG. 14 corresponds to item 130 in FIG. 13. This provides verification and checking means. For example, if the symbol function shown in FIG. 14 does not contain a "ring" in the symbol function, then no guard ring exists. If the symbol is required to have a guard ring and none is present, then an error may be generated (ie, the presence of the lower symbol or lack of the higher symbol). Symbol hierarchy can then be utilized to evaluate design compliance for ESD and latchup. The higher order symbol function can also store all the essential latchup and ESD metrics for evaluation of latchup robustness, guard ring efficiency, and a means of checking and verification.

Other benefits from this invention include the ability to evaluate noise, noise coupling, and single event upset tolerance. Noise coupling can be evaluated by establishing different algorithms in the evaluation process. Circuit-to-circuit noise coupling can be evaluated using the same methodology. This is achieved by evaluation of how the guard ring efficiency influences the coupling between two circuits. The verification and checking process can be used to identify the types of circuits and evaluate digital-to-analog noise coupling, RF-to-digital noise coupling, ESD-to-RF noise coupling and other combinations and permutations of circuit interactions. The evaluation of the type of guard ring and the correspondence to the correct circuit type can be used to guarantee a noise free environment between two circuits or circuit blocks. Hence, the invention is applicable to the issue of noise and noise coupling and the evaluation of the proper guard rings to minimize and optimize this parameter.

This invention can be utilized for soft error rate analysis and the effectiveness of the guard rings around circuits to minimize minority carrier injection from single event upsets. This method can be used to guarantee the correct guard ring for certain circuits sensitive to single event upset (SEU). For example, this method can guarantee the correct guard ring for different SRAM cells, and to evaluate and verify the correct correspondence. Hence, the invention is applicable to the issue of soft errors or single event upsets and the evaluation of the proper guard rings to minimize and optimize this parameter. The invention also applicable to circuit blocks such as analog blocks and digital circuit blocks on a global chip method as opposed to locally in a semiconductor chip. The invention improves chip density and performance by providing an optimized and co-optimized design system. Various modifications may be made to the structures of the invention as set forth above without departing from the spirit and scope of the invention as described and claimed

The invention claimed is:

1. A method of displaying a guard ring within an integrated circuit design having logic devices, said method comprising:
   determining type of logic devices within said integrated circuit design;
   determining positions of said logic devices within said integrated circuit design;
   selecting type of guard rings which are appropriated with determined type of logic devices;
   incorporating said guard ring into determined logic devices within said integrated circuit design; and
   displaying said logic devices and said guard ring as symbolically and schematically in a single integrated display,
   wherein said displaying of said logic devices and said guard ring symbolically comprises displaying a parameterized symbol,
   wherein said parameterized symbol comprises parameters, wherein said parameters comprise at least one of a type of said guard ring and an efficiency of said guard ring.

2. The method in claim 1, further comprising displaying said logic devices and said guard ring graphically in said single display.

3. The method in claim 2, wherein said displaying of said logic devices and said guard ring graphically comprises illustrating relative positions of said logic devices and said guard ring.

4. The method in claim 1, wherein said displaying of said parameterized symbol comprises displaying said parameters including a type of circuit.

5. The method in claim 1, wherein said displaying of said parameterized symbol comprises displaying said parameters including a type of circuit and an efficiency of said guard ring.

6. A method of displaying at least one guard ring within a hierarchical integrated circuit design having logic devices, a parameterized cell, and said at least one guard ring, said method comprising:
   determining type of logic devices within said integrated circuit design;
   establishing positions of said logic devices within a portion of said hierarchical integrated circuit design;
   selecting type of guard rings which are appropriated with determined type of logic devices;
   incorporating said guard ring into determined logic devices within said portion of said hierarchical integrated circuit design; and
   displaying said portion of said integrated circuit design as a cell having said guard ring within said hierarchical integrated circuit design,
   wherein said displaying of said portion of said integrated circuit design comprises displaying said logic devices and said guard ring symbolically and schematically in a single integrated display,
   wherein said displaying of said logic devices and said guard ring as symbolically comprises displaying a parameterized symbol,
   wherein said parameterized symbol comprises parameters, wherein said parameters comprise at least one of a type of said guard ring and an efficiency of said guard ring.

7. The method in claim 6, wherein said displaying of said portion of said integrated circuit design comprises graphically illustrating relative positions of said logic devices and said guard ring.

8. The method in claim 6, wherein said displaying of said parameterized symbol comprises displaying said parameters including a type of circuit.

9. The method in claim 6, wherein said displaying of said parameterized symbol comprises displaying said parameters including a type of circuit and an efficiency of said guard ring.

10. A program storage device readable by machine, tangibly embodying a program of instructions executable by the machine to perform a method of displaying a guard ring within an integrated circuit design having logic devices, said method comprising:
    determining type of logic devices within said integrated circuit design;
    determining positions of said logic devices within said integrated circuit design;
    selecting type of guard rings which are appropriated with determined type of logic devices;
    incorporating said guard ring into determined logic devices within said integrated circuit design; and displaying said logic devices and said guard ring as symbolically and schematically in a single integrated display,
wherein said displaying of said logic devices and said guard ring symbolically comprises displaying a parameterized symbol,
wherein said parameterized symbol comprises parameters, wherein said parameters comprise at least one of a type of said guard ring and an efficiency of said guard ring.

11. The program storage device in claim 10, further comprising displaying said logic devices and said guard ring graphically in a single display.

12. The program storage device in claim 11, wherein said displaying of said logic devices and said guard ring graphically comprises illustrating relative positions of said logic devices and said guard ring.

13. The program storage device in claim 10, wherein said displaying of said parameterized symbol comprises displaying said parameters including a type of circuit.

14. The program storage device in claim 10, wherein said displaying of said parameterized symbol comprises displaying said parameters including a type of circuit and an efficiency of said guard ring.

* * * * *